(12) United States Patent
Shiraishi

(10) Patent No.: US 7,557,900 B2
(45) Date of Patent: Jul. 7, 2009

(54) EXPOSURE APPARATUS, DEVICE MANUFACTURING METHOD, MAINTENANCE METHOD, AND EXPOSURE METHOD

(75) Inventor: Kenichi Shiraishi, Saitama (JP)

(73) Assignee: Nikon Corporation, Tokyo (JP)

( * ) Notice: Subject to any disclaimer, the term of this patent is extended or adjusted under 35 U.S.C. 154(b) by 241 days.

(21) Appl. No.: 10/588,146

(22) PCT Filed: Feb. 8, 2005

(86) PCT No.: PCT/JP2005/001827

§ 371 (c)(1),
(2), (4) Date: Nov. 6, 2006

(87) PCT Pub. No.: WO2005/076323

PCT Pub. Date: Aug. 18, 2005

(65) Prior Publication Data

US 2007/0159610 A1    Jul. 12, 2007

(30) Foreign Application Priority Data

Feb. 10, 2004    (JP) .............................. 2004-033679

(51) Int. Cl.
G03B 27/42    (2006.01)
G03B 27/52    (2006.01)
G03B 27/32    (2006.01)
(52) U.S. Cl. .............................. 355/53; 355/30; 355/77
(58) Field of Classification Search .................. 355/30, 355/53, 72, 77; 359/509
See application file for complete search history.

(56) References Cited

U.S. PATENT DOCUMENTS

| 5,528,118 | A | 6/1996 | Lee |
| 5,610,683 | A | 3/1997 | Takahashi |
| 5,623,853 | A | 4/1997 | Novak et al. |
| 5,825,043 | A | 10/1998 | Suwa |
| 5,874,820 | A | 2/1999 | Lee |
| 5,969,441 | A | 10/1999 | Loopstra et al. |
| 6,208,407 | B1 | 3/2001 | Loopstra |
| 6,341,007 | B1 | 1/2002 | Nishi et al. |
| 6,400,411 | B1 | 6/2002 | Bayes et al. |
| 6,549,269 | B1 | 4/2003 | Nishi et al. |
| 6,591,634 | B1 | 7/2003 | Morizane |
| 7,388,649 | B2 * | 6/2008 | Kobayashi et al. ............ 355/53 |
| 2001/0019399 | A1 | 9/2001 | Hagiwara |
| 2003/0139763 | A1 | 7/2003 | Nakagawa et al. |
| 2004/0020782 | A1 | 2/2004 | Cohen et al. |
| 2004/0165159 | A1 | 8/2004 | Lof et al. |

FOREIGN PATENT DOCUMENTS

| DE | 221 563 A1 | 4/1985 |
| JP | A 57-117238 | 7/1982 |
| JP | A-59-19912 | 2/1984 |

(Continued)

*Primary Examiner*—Alan A Mathews
(74) *Attorney, Agent, or Firm*—Oliff & Berridge, PLC

(57) ABSTRACT

An exposure apparatus can prevent disadvantages of supplying liquid of reduced cleanliness and formation of watermarks. The exposure apparatus (EX) exposes a substrate (P) by irradiating exposure light (EL) onto the substrate (P) via a projection optical system (PL) and a liquid (LQ), and includes a liquid supply mechanism (10) for supplying the liquid (LQ), and a measuring device (60) which measures a time during which the supply of the liquid from the liquid supply mechanism is stopped (10).

18 Claims, 4 Drawing Sheets

FOREIGN PATENT DOCUMENTS

| | | |
|---|---|---|
| JP | A 04-65603 | 3/1992 |
| JP | A 06-124873 | 5/1994 |
| JP | A 06-188169 | 7/1994 |
| JP | A 07-176468 | 7/1995 |
| JP | A 08-37149 | 2/1996 |
| JP | A 08-166475 | 6/1996 |
| JP | A 08-330224 | 12/1996 |
| JP | A 10-163099 | 6/1998 |
| JP | A 10-214783 | 8/1998 |
| JP | A-10-303114 | 11/1998 |
| JP | A-10-340846 | 12/1998 |
| JP | A 11-16816 | 1/1999 |
| JP | A-11-176727 | 7/1999 |
| JP | A-2000-058436 | 2/2000 |
| JP | A 2000-505958 | 5/2000 |
| JP | A 2002-14005 | 1/2002 |
| JP | A-2005-064210 | 3/2005 |
| WO | WO 99/49504 * | 9/1999 |
| WO | WO 99/49504 A1 | 9/1999 |
| WO | WO 2004/019128 A2 | 3/2004 |
| WO | WO 2004/105107 A1 | 12/2004 |
| WO | WO 2005/020299 A1 | 3/2005 |

* cited by examiner

EXPOSURE APPARATUS, DEVICE MANUFACTURING METHOD, MAINTENANCE METHOD, AND EXPOSURE METHOD

TECHNICAL FIELD

The present invention relates to an exposure apparatus that exposes a substrate by irradiating an exposure light onto the substrate via a projection optical system and a liquid, a device manufacturing method, a maintenance method, and an exposure method.

Priority is claimed on Japanese Patent Application No. 2004-033679, filed Feb. 10, 2004, the content of which is incorporated herein by reference.

BACKGROUND ART

Semiconductor devices and liquid crystal display devices are manufactured by a procedure known as photolithography, in which a pattern formed on a mask is transferred onto a photosensitive substrate. An exposure apparatus used in this photolithography process includes a mask stage which supports the mask and a substrate stage which supports the substrate, and transfers the pattern on the mask via a projection optical system while constantly moving the mask stage and the substrate stage. Recently, in order to deal with increasing integration of device patterns, there is a demand to further increase the resolution of projection optical devices. The resolution of a projection optical device increases when the exposure wavelength being used is shorter, and when the projection optical system has a higher numerical aperture. Accordingly, exposure wavelengths used in projection optical systems are becoming shorter, and their numerical aperture is increasing, year by year. While the current mainstream exposure wavelength is the 248-nm wavelength of a KrF excimer laser, an even shorter length, the 193-nm wavelength of an ArF excimer laser, is also going into actual use.

As with the resolution, depth of field (DOF) is also important when exposing light. Resolution R and depth of field δ are expressed by the following equations.

$$R = k_1 \cdot \lambda / NA \quad (1)$$

$$\delta = \pm k_2 \cdot \lambda / NA^2 \quad (2)$$

where $\lambda$ is the exposure wavelength, NA is the numerical aperture of the projection optical system, and $k_1$ and $k_2$ are process coefficients. As is clear from Equations (1) and (2), when the exposure length $\lambda$ is shortened and the numerical aperture NA is increased in order to increase the resolution R, the depth of field δ becomes narrower.

If the depth of field δ is too narrow, it becomes difficult to match the substrate surface to the projection face of the projection optical system, and the field margin during the exposure operation may not be sufficient. As an example of a method of actually shortening the exposure wavelength while increasing the depth of field, Patent Document 1 discloses the immersion method. In this immersion method, an area between a bottom face of the projection optical system and the substrate surface is filled with a liquid, such as water or an organic solvent, to form an immersion region, and, utilizing the fact that the wavelength of exposure light in liquid becomes 1/n of its wavelength in air (where n is the refractive index of the liquid, and is normally approximately between 1.2 and 1.6), the resolution is increased while multiplying the depth of field n times.

Patent Document 1: PCT International Publication No. WO 99/49504

DISCLOSURE OF INVENTION

Problems to be Solved by the Invention

In the mean time, in an immersion exposure apparatus, when a liquid resides in a liquid supply pipe or the like which supplies the liquid, its cleanliness may deteriorate since the liquid remains stagnant in the liquid supply pipe. When liquid of reduced cleanliness is supplied onto the substrate and exposure and measuring processes are performed through this liquid, the substrate may become contaminated and precision of exposure and measurements may deteriorate. Furthermore, for example, after collecting liquid on an image surface side of the projection optical system, when liquid cannot be completely collected from certain members, such as optical members of an image surface frontal end section of the projection optical system and measuring members on the substrate stage, and the liquid remains there for a long time and dries, marks of the liquid may be formed on the predetermined members, such as the optical members of the image surface frontal end section of the projection optical system and measuring members on the substrate stage, and foreign particles may then stick and cause deterioration in the precision of the exposure and measuring processes.

The present invention has been made in view of the above-mentioned problems, and an object thereof is to provide an exposure apparatus which can prevent the disadvantage of supplying liquid of reduced cleanliness, a device manufacturing method, a maintenance method, and an exposure method. Another object is to provide an exposure apparatus which can prevent marks of the liquid from being formed on members which contact the liquid, a device manufacturing method, a maintenance method, and an exposure method.

Means for Solving the Problems

An exposure apparatus of the invention exposes a substrate by irradiating exposure light onto it via a projection optical system and a liquid, and includes a liquid supply mechanism that supplies the liquid, and a measuring device which measures a time during which the supply of the liquid from the liquid supply mechanism is stopped.

According to the invention, by using the measuring device to measure the a time during which the supply of the liquid from the liquid supply mechanism is stopped, appropriate procedures can be performed based on the measurement result, such as flushing the supply pipes by restarting the liquid supply before the liquid stagnates in the supply pipes and its cleanliness decreases. Therefore, problems caused by supplying liquid whose cleanliness has decreased after stagnation onto the substrate can be prevented. Furthermore, based on the measurement result, appropriate procedures such as moistening the predetermined members by supplying the liquid can be performed before marks of remaining liquid stuck on predetermined members are formed by drying of residual liquid. Thus, even if there is a possibility of problems caused by stopping the supply of the liquid from the liquid supply mechanism, appropriate procedures can be performed based on the measurement result, whereby generation of such problems can be prevented.

A device manufacturing method of the invention uses the exposure apparatus described above. According to the invention, since appropriate procedures can be performed based on the measurement result of the measuring device which measures the a time during which the supply of the liquid from the liquid supply mechanism is stopped, problems caused by stopping the supply of the liquid from the liquid supply mechanism can be prevented. Therefore, it is possible to manufacture a device with a desired performance.

A maintenance method of the invention is a maintenance method of a projection optical system, which projects an image of a pattern via a liquid, and includes measuring the elapsed time between an immersed state of an end face on an image surface side of the projection optical system and a non-immersed state.

According to the invention, by measuring the elapsed time between an immersed state of the end face on the image surface side of the projection optical system and the non-immersed state, based on the measurement result, the end face of the projection optical system can be wet (moistened) by supplying the liquid before marks are formed by drying of residual liquid. Therefore, it is possible to prevent the problem of sticky marks being formed on the end face of the image surface side of the projection optical system. Thus, since appropriate procedures can be performed based on the measurement result of the elapsed time, generation of problems caused by switching from the immersed state to the non-immersed state can be prevented.

An exposure method of the invention uses a projection optical system maintained using the method described above, and exposes a substrate to light by projecting an image of a device pattern via liquid onto the substrate.

According to the invention, the substrate can be reliably exposed via the projection optical system and the liquid in state where formation of marks of the liquid is prevented.

Advantageous Effects of the Invention

According to the invention, exposure precision and measurement precision can be reliably ensured.

BEST MODES FOR CARRYING OUT THE INVENTION

Figure 1:
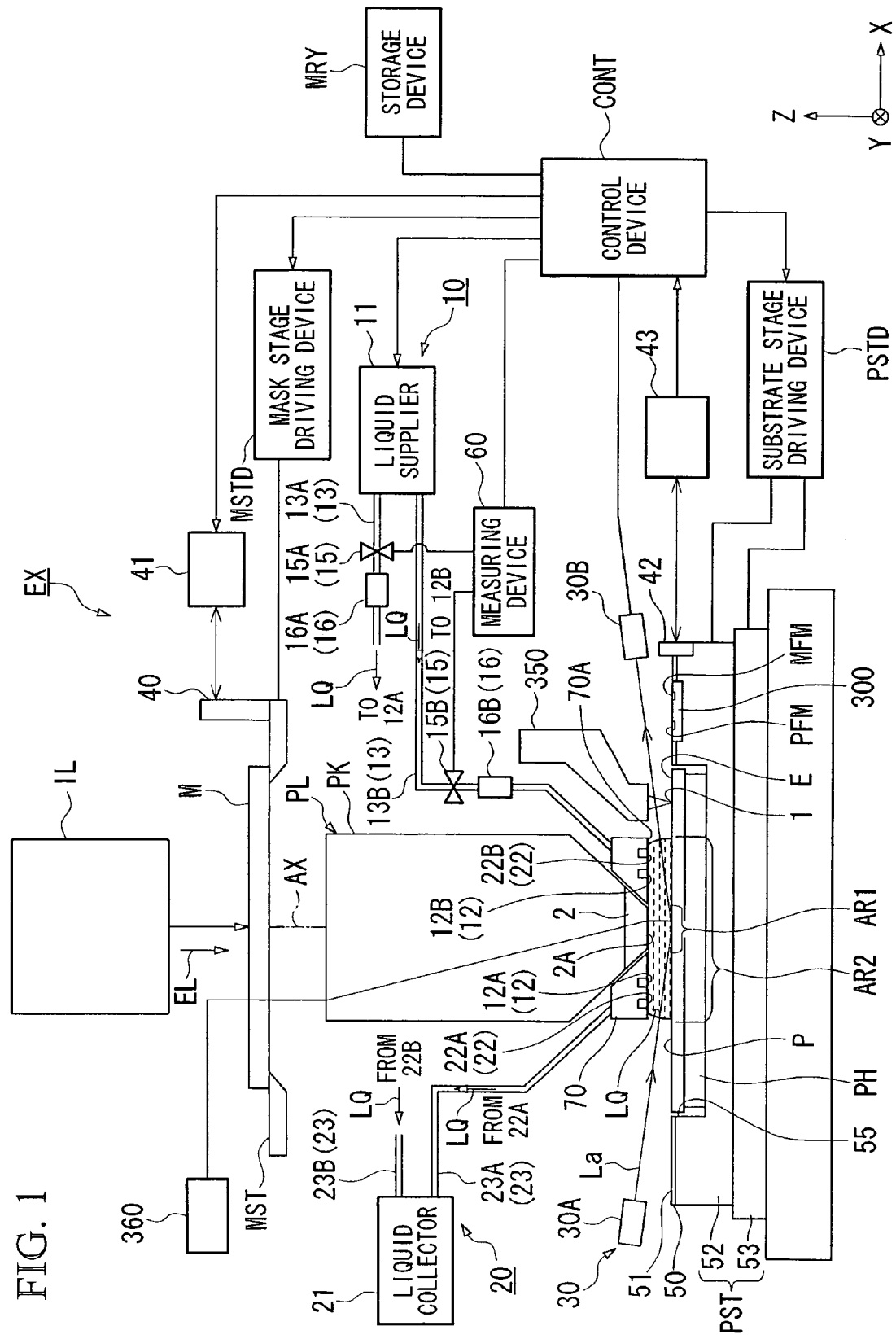
FIG. 1 is a schematic configuration diagram showing an embodiment of an exposure apparatus of the invention.

An exposure apparatus of the invention will be explained with reference to the drawings. FIG. 1 is a schematic configuration diagram showing an embodiment of an exposure apparatus of the invention.

In FIG. 1, an exposure apparatus EX includes a mask stage MST which supports a mask M and is movable, a substrate holder PH which holds a substrate P, a movable substrate stage PST which holds the substrate P on the substrate holder PH, an illuminating optical system IL which illuminates an exposure light EL onto the mask M while it is supported by the mask stage MST, a projection optical system PL which projects an image of a pattern of the mask M illuminated by the exposure light EL onto the substrate P which is supported by the substrate stage PST, a measuring device (timer) 60 which measures time, a control device CONT which controls operations of the entire exposure apparatus EX in a centralized manner, and a storage device MRY which stores various kinds of information relating to exposure processing.

The exposure apparatus EX of this embodiment is an immersion exposure apparatus which utilizes a liquid immersion method to substantially shorten the exposure wavelength in order to increase the resolution and actually increase the depth of field, and includes a liquid supply mechanism 10 which supplies a liquid LQ onto the substrate P and a liquid collection mechanism 20 which collects the liquid LQ on the substrate P. In this embodiment, pure water is used as the liquid LQ. At least while an image of the pattern of the mask M is being transferred onto the substrate P, the exposure apparatus EX uses the liquid LQ supplied from the liquid supply mechanism 10 to locally form, in at least one part of the substrate P including a projection region AR1 of the projection optical system PL, an immersion region AR2 which is larger than the projection region AR1 and smaller than the substrate P. Specifically, the exposure apparatus EX fills the liquid LQ in an area between an optical element 2 at an image surface side frontal end of the projection optical system PL and a top face (exposure surface) of the substrate P, and projects an image of the pattern of the mask M onto the substrate P via the liquid LQ between the projection optical system PL and the substrate P, and via the projection optical system PL, thereby exposing the substrate P.

In this embodiment, an example where the exposure apparatus EX is a scanning-type exposure apparatus (so-called a scanning stepper) which simultaneously moves the mask M and the substrate P in different directions with respect to each other (opposite directions) within a scanning direction (predetermined direction) while carrying out exposure to project the pattern formed on the mask M onto the substrate P. In the following explanation, a direction of synchronous motion of the mask M and the substrate P within a horizontal plane (scanning direction, or predetermined direction) is referred to as the X-axis direction, a direction orthogonal to the X-axis direction in the horizontal plane is referred to as the Y-axis direction (non-scanning direction), and a direction which is perpendicular to the X-axis and Y-axis directions and matches an optical axis AX of the projection optical system PL is referred to as the Z-axis direction. Rotational (gradient) directions around the X-axis, Y-axis, and Z-axis directions are respectively termed $\theta X$, $\theta Y$, and $\theta Z$ directions. Note that the term "substrate" here includes one formed by coating a semiconductor wafer with a resist, and "mask" includes a reticule having a device pattern which is reduced projected onto a substrate.

The illuminating optical system IL illuminates the exposure light EL onto the mask M supported by the mask stage MST, and includes a light source for exposure, an optical integrator which uniformizes the luminance of a beam emitted from the light source for exposure, a condenser lens which focuses the exposure light EL from the optical integrator, a relay lens system, a variable-field aperture which sets a region on the mask M illuminated by the exposure light EL to a slit shape, and the like. The illuminating optical system IL illuminates a predetermined illumination region on the mask M using the exposure light EL having an even luminance distribution. Examples of light which can be used as the exposure light EL emitted from the exposure apparatus EX are deep ultraviolet light (DUV light) such as emission lines (g-line, h-line, and i-line) emitted from a mercury lamp and KrF excimer laser light (wavelength: 248 nm), and vacuum ultraviolet light (VUV light) from an ArF excimer layer (wavelength: 193 nm), an $F_2$ laser (wavelength: 157 nm), etc. This embodiment uses ArF excimer laser light. As described above, the liquid LQ of this embodiment is pure water, which can transmit even exposure light EL from an ArF excimer laser. Pure water also allows transmission of far ultraviolet light (DUV light) such as emission lines (g-line, h-line, and i-line) emitted from a mercury lamp and KrF excimer laser light (wavelength: 248 nm).

The mask stage MST can move while holding the mask M, being capable of moving two-dimensionally within a plane perpendicular to the optical axis AX of the projection optical system PL, i.e., within the X-Y plane, and also minutely rotating in the θZ direction. The mask stage MST is driven by a mask stage driving device MSTD such as a linear motor. The mask stage driving device MSTD is controlled by the control device CONT. A moving mirror 40 is provided on the mask stage MST. A laser interferometer 41 is provided facing the moving mirror 40. The laser interferometer 41 measures the two-dimensional directional position and the rotation angle of the mask M on the mask stage MST in real time, and outputs a measurement result to the control device CONT. The control device CONT positions the mask M, which is supported by the mask stage MST, by driving the mask stage MST based on the measurement result of the laser interferometer 41.

The projection optical system PL uses exposure to project the pattern of the mask M onto the substrate P at a predetermined projection magnification β, and comprises a plurality of optical elements including an optical element (lens) 2 provided at a frontal end of the substrate P side, these optical elements being supported by a lens barrel PK. In this embodiment, the projection optical system PL is a reduction system with a projection magnification β of, for example, ¼ or ⅕. The projection optical system PL may be one of a same-size system or an enlargement system. The projection optical system PL may be one of a reflecting system which does not include a refracting element, a refracting system which does not include a reflecting element, and a catadioptric system which includes a refracting element and a reflecting element.

In this embodiment, the frontal end of the projection optical system PL can be attached/removed (replaced) with respect to the lens barrel PK. The optical element 2 at the frontal end is exposed from the lens barrel PK, and the liquid LQ in the immersion region AR2 contacts the optical element 2. This prevents corrosion and the like of the lens barrel PK, which is made of metal.

The optical element 2 is formed from fluorite. Since fluorite has high affinity with pure water, the liquid LQ can be made to closely adhere to almost all of a liquid contact face (end face) 2A of the optical element 2. That is, since this embodiment supplies a liquid (water) LQ having high affinity with the liquid contact face 2A of the optical element 2, there is very close adhesion between the liquid LQ and the liquid contact face 2A of the optical element 2, and the optical element 2 may be quartz, which has affinity with water. The liquid contact face 2A of the optical element 2 may be treated to provide hydrophilic property (liquid affinity) to increase its affinity with the liquid LQ.

The substrate stage PST includes a Z stage 52 which holds the substrate P with the substrate holder PH therebetween, and an XY stage 53 which supports the Z stage 52. The XY stage 53 is supported on a base 54. The substrate stage PST is driven by a substrate stage driving device PSTD such as a linear motor. The substrate stage driving device PSTD is controlled by the control device CONT. The Z stage 52 can move the substrate P held by the substrate holder PH in the Z-axis direction and in the θX and θY directions (gradient directions). The XY stage 53 can move the substrate P held by the substrate holder PH in the XY direction (a direction substantially parallel to the image surface of the projection optical system PL) and in the θZ direction. The Z stage and the XY stage can, of course, be provided in a single piece.

A concave 55 is provided on the substrate stage PST, and the substrate holder PH is arranged in the concave 55. A top face 51 of the substrate stage PST other than the concave 55 forms a flat face (flat section) which is approximately the same height (same plane) as the surface of the substrate P held by the substrate holder PH. In this embodiment, a plate member 50 including the top face 51 is arranged on the substrate stage PST such that the plate member 50 can be replaced. Since the top face 51, provided almost in a single plane with the surface of the substrate P, is arranged around the substrate P, when immersion-exposing an edge region E of the substrate P, the liquid LQ can be held on the image surface side of the projection optical system PL and the immersion region AR2 can be formed satisfactorily. Although there is a gap of approximately 0.1 to 2 mm between the edge section of the substrate P and the plate member 50 which includes the flat face (top face) 51 and is provided around the substrate P, the surface tension of the liquid LQ ensures that almost none of it wets and spreads into this gap, enabling the liquid LQ to be held below the projection optical system PL by the plate member 50 when exposing the surrounding area of the substrate P to light.

Providing that the immersion region AR2 can be formed such that the optical path space on the image surface side of the projection optical system PL is filled with the liquid LQ, there may acceptably be a slight step between the surface of the substrate P and the top face 51; for example in the Z direction, the top face 51 may be lower than the surface of the substrate P.

A moving mirror 42 is provided on the substrate stage PST (Z stage 52). A laser interferometer 43 is provided facing the moving mirror 42. The laser interferometer 43 measures the two-dimensional directional position and the rotation angle of the substrate P on the substrate stage PST in real time, and outputs a measurement result to the control device CONT. Based on the measurement result from the laser interferometer 43, the control device CONT drives the XY stage 53 via the substrate stage PST within a two-dimensional coordinate system stipulated by the laser interferometer 43, and thereby positions the substrate P, which is supported by the substrate stage PST, in the Z-axis direction and the Y-axis direction.

The exposure apparatus EX also includes a focus detection system 30 which detects face position information of the substrate P surface. The focus detection system 30 includes an emitter 30A and a photoreceiver 30B, and detects face position information of the substrate P surface by emitting detection light La from the emitter 30A from a diagonal direction onto the substrate P surface (exposure surface) via the liquid LQ from the emitter 30A and receiving light reflected from the substrate P at the photoreceiver 30B via the liquid LQ. The control device CONT controls operations of the focus detection system 30, and, based on the photoreception result of the photoreceiver 30B, detects the Z-axis directional position (focus position) of the substrate P surface with respect to a predetermined reference face (image surface). By determining focus positions at a plurality of points on the substrate P surface, the focus detection system 30 can determine the posture of the substrate P in a diagonal direction. A system disclosed in, for example, Japanese Unexamined Patent Publication, First Publication No. H8-37149 can be used in configuring the focus detection system 30. The focus detection system 30 may be one which detects the face position information of the substrate P surface without emitting/receiving light through the liquid LQ. In this case, the emission position of the detection light La of the focus detection system 30 may be set at a distance from the projection region AR1 of the projection optical system PL.

The control device CONT drives the Z stage 52 of the substrate stage PST via the substrate stage driving device PSTD, and thereby controls the Z-axis directional position (focus position) of the substrate P held on the Z stage 52, and its positions in the θX and θY directions. That is, the Z stage 52 moves based on a command from the control device CONT based on the detection result of the focus detection system 30, the focus position (Z position) and gradient angle of the substrate P being controlled such that the surface (exposure surface) of the substrate P is aligned with the image surface formed via the projection optical system PL and the liquid LQ.

A substrate alignment system 350 is provided near the frontal end of the projection optical system PL, and detects an alignment mark 1 on the substrate P or a substrate side reference mark PFM on a reference member 300 provided on the Z stage 52. The substrate alignment system 350 of this embodiment utilizes a field image alignment (FIA) method, such as that disclosed in Japanese Unexamined Patent Publication, First Publication No. H4-65603, which holds the substrate stage PST stationary while irradiating an illuminating light such as white light from a halogen lamp onto a mark, uses an image-capturing element to capture an image of the obtain mark within a predetermined image-capturing field, and measures the position of the mark using image processing.

A mask alignment system 360 is provided near the mask stage MST, and detects a mask side reference mark MFM on the reference member 300 provided on the Z stage 52 via the mask M and the projection optical system PL. The mask alignment system 360 of this embodiment utilizes a visual reticule alignment (VRA) method, such as that disclosed in Japanese Unexamined Patent Publication, First Publication No. H7-176468, which illuminates the mark with light, and detects the mark position by image processing image data of the mark captured by a CCD camera and the like.

The liquid supply mechanism 10 supplies a predetermined liquid LQ to the image surface side of the projection optical system PL, and includes a liquid supplier 11 capable of delivering the liquid LQ, and supply pipes 13 (13A and 13B) either ends of which are connected to the liquid supplier 11. The supply pipes 13 have flow passages for allowing the liquid LQ to flow. The liquid supplier 11 includes a tank for storing the liquid LQ, a pressure pump, and so on. The control device CONT controls the liquid supply operation of the liquid supplier 11. When forming the immersion region AR2 on the substrate P, the liquid supply mechanism 10 supplies the liquid LQ onto the substrate P.

Note that the tank, the pressure pump, and so on of the liquid supplier 11 need not be included in the exposure apparatus EX; instead, it is acceptable to use facilities of a factory or the like where the exposure apparatus EX is installed.

Valves 15A and 15B for opening/closing the flow passages of the supply pipes 13A and 13B are provided midway along the supply pipes 13A and 13B, respectively. The opening/closing operations of the valves 15 (15A and 15B) are controlled by the control device CONT. The valves 15 of this embodiment utilize a so-called normal close method, which mechanically closes the flow passages of the supply pipes 13A and 13B when a drive source (power source) of the exposure apparatus EX (control device CONT) stops due to a power failure or the like.

The measuring device 60 which measures time is connected to the valves 15 (15A and 15B). The measuring device 60 can detect whether the valves 15 have closed the flow passages of the supply pipes 13, and starts measuring time when it detects that the control device CONT has closed the valves 15. The measuring device 60 measures the time elapsed since the valves 15 closed the flow passages of the supply pipes 13, i.e., the a time during which the supply of the liquid from the liquid supply mechanism is stopped 10, and outputs the measurement result to the control device CONT. When the measuring device 60 detects that the control device CONT has opened the valves 15, it stops measuring time and resets the measured time (returns it to zero).

The measuring device 60 can also measure the time elapsed since the valves 15 open the flow passages of the supply pipes 13, i.e., the liquid supply time of the liquid supply mechanism 10. The measuring device 60 outputs this measurement result to the control device CONT.

The liquid collection mechanism 20 collects the liquid LQ from the image surface side of the projection optical system PL, and includes a liquid collector 21 capable of collecting the liquid LQ, and collection pipes 23 (23A and 23B) either ends of which are connected to the liquid collector 21. The liquid collector 21 utilizes a vacuum system (suction device) such as a vacuum pump, an air-liquid separator which separates the collected liquid LQ from the air, a tank for containing the collected liquid LQ, and so on. Instead of fitting the exposure apparatus EX with a vacuum pump, a vacuum system of a factory where the exposure apparatus EX is installed may be used as the vacuum system. The liquid collection operation of the liquid collector 21 is controlled by the control device CONT. To form the immersion region AR2 on the substrate P, the liquid collection mechanism 20 collects a predetermined amount of the liquid LQ on the substrate P supplied by the liquid supply mechanism 10.

Note that the vacuum system, the air-liquid separator, tank, and the like of the liquid collector 21 need not be included in the exposure apparatus EX; instead, it is possible to use equipment at a factory or the like where the exposure apparatus EX is installed.

Among the plurality of optical elements which form the projection optical system PL, a flow passage formation member 70 is arranged near the optical element 2 which contacts the liquid LQ. The flow passage formation member 70 is a ring-shaped member provided above the substrate P (substrate stage PST) such as to enclose the side faces of the optical element 2. A gap is provided between the flow passage formation member 70 and the optical element 2, and the flow passage formation member 70 is supported by a predetermined support mechanism such that it is separated vibrationally from the optical element 2.

The flow passage formation member 70 can be formed from aluminum, titanium, stainless steel, duralumin, or an alloy of these. Alternatively, the flow passage formation member 70 may be constructed from a light-transmitting transparent member (optical member) such as glass (quartz).

The flow passage formation member 70 includes liquid supply openings 12 (12A and 12B) which are provided above the substrate P (substrate stage PST) and face the substrate P surface. In this embodiment, the flow passage formation member 70 includes two liquid supply openings 12A and 12B. The liquid supply openings 12A and 12B are provided in a bottom face 70A of the flow passage formation member 70.

The flow passage formation member 70 contains supply flow passages which correspond to the liquid supply openings 12A and 12B. A plurality of (two) supply pipes 13A and 13B are provided in correspondence with the liquid supply openings 12A and 12B and the supply flow passages. One end of each supply flow passage connects to the liquid supplier 11 via the supply pipes 13A and 13B, and another end of each connects to the liquid supply openings 12A and 12B.

Flow meters 16 (16A and 16B) are provided midway along each of the supply pipes 13A and 13B, and measure the amount of flow per unit of time of the liquid LQ which is supplied from the liquid supplier 11 and flows along the supply pipes 13A and 13B. Measurement results from the flow meters 16A and 16B are output to the control device CONT.

Based on the measurement results of the flow gauges 16, the control device CONT can determine whether the liquid supply mechanism 10 is supplying liquid along the supply pipes 13. That is, when the control device CONT determines, based on the measurement results of the flow meters 16, that the liquid LQ is not flowing along the flow passages of the supply pipes 13, it can determine that the supply of the liquid from the liquid supply mechanism 10 has stopped. On the other hand, when the control device CONT determines, based on the measurement results of the flow gauges 16, that the liquid LQ is flowing along the flow passages of the supply pipes 13, it determines that the liquid supply mechanism 10 is supplying liquid.

Flow control devices known as mass flow controllers (not shown) are provided midway along the supply pipes 13A and 13B, and controls the amounts per unit of time of liquid supplied from the liquid supplier 11 along the liquid supply openings 12A and 12B. These flow rate controllers control the amount of liquid supplied in compliance with command signals from the control device CONT.

The flow passage formation member 70 also includes liquid collection openings 22 (22A and 22B) which are provided above the substrate P (substrate stage PST) and arranged facing the substrate P surface. In this embodiment, the flow passage formation member 70 has two liquid collection openings 22A and 22B. The liquid collection openings 22A and 22B are provided in the bottom face 70A of the flow passage formation member 70.

The flow passage formation member 70 also includes collection flow passages corresponding to the liquid collection openings 22A and 22B. A plurality of (two) collection pipes 23A and 23B are provided such as to correspond to the liquid collection openings 22A and 22B and the collection flow passages. One end of each supply flow passage connects to the liquid collector 21 via the collection pipes 23A and 23B, and another end of each connects to the liquid collection openings 22A and 22B.

In this embodiment, the flow passage formation member 70 forms one part of each of the liquid supply mechanism 10 and the liquid collection mechanism 20. The liquid supply openings 12A and 12B which form the liquid supply mechanism 10 are arranged on respective sides of the X axis direction with the projection region AR1 of the projection optical system PL between them, and the liquid collection openings 22A and 22B which form the liquid collection mechanism 20 are provided on outer sides of the liquid supply openings 12A and 12B of the liquid supply mechanism 10 with respect to the projection region AR1 of the projection optical system PL. In this embodiment, the projection region AR1 of the projection optical system PL is set to a rectangular shape in plan view with its longitudinal direction in the Y-axis direction and its short direction in the X-axis direction.

The control device CONT controls the operations of the liquid supplier 11 and the flow rate controllers. When supplying the liquid LQ onto the substrate P, the control device CONT delivers the liquid LQ from the liquid supplier 11, and supplies it via the supply pipes 13A and 13B, and the supply flow passages, onto the substrate P from the liquid supply openings 12A and 12B provided above the substrate P. At this time, the liquid supply openings 12A and 12B are arranged on respective sides of the projection region AR1 of the projection optical system PL, enabling the liquid LQ to be supplied from both sides of the projection region AR1 via the liquid supply openings 12A and 12B. The amounts of the liquid LQ that are supplied from the liquid supply openings 12A and 12B onto the substrate P per unit of time can be individually controlled by the flow rate controllers which are respectively provided along the supply pipes 13A and 13B.

The control device CONT controls the liquid collection operation of the liquid collector 21. The control device CONT can control the amount of liquid collected by the liquid collector 21 amount per unit of time. The liquid LQ on the substrate P collected from the liquid collection openings 22A and 22B provided above the substrate P is collected to the liquid collector 21 via the flow passages of the flow passage formation member 70 and via the collection pipes 23A and 23B.

While in this embodiment, the supply pipes 13A and 13B are connected to one liquid supplier 11, a plurality of liquid suppliers 11 (two in this case) may be provided in correspondence with the number of supply pipes, and the supply pipes 13A and 13B may be respectively connected to the plurality of liquid suppliers 11. While the collection pipes 23A and 23B are connected to one liquid collector 21, a plurality of liquid collectors 21 (two in this case) may be provided in correspondence with the number of collection pipes, and the collection pipes 23A and 23B may be respectively connected to the plurality of liquid collectors 21.

The mechanism for forming the immersion region AR2 locally on the substrate P (substrate stage PST) is not limited to that described above, it being possible to us a mechanism such as that disclosed in US Patent Application No. 2004/020782, and the some of the contents of the document is herein incorporated in this text, within the limits permitted by national regulations of countries designated or elected in this international application.

The liquid contact face 2A of the optical element 2 of the projection optical system PL and the bottom face (liquid contact face) 70A of the flow passage formation member 70 have hydrophilic property (affinity with liquid). In this embodiment, the liquid contact faces of the optical element 2 and the flow passage formation member 70 are imparted liquid affinity, thereby giving them hydrophilic property. In other words, hydrophilic property is given to the liquid contact faces of surfaces of at least the members which are opposite the exposed face (surface) of the substrate P held by the substrate stage PST. Since the liquid LQ of this embodiment is water with high polarity, the liquid affinity (hydrophilic) treatment may include, for example, forming a thin film of a substance with a highly polar molecular structure such as alcohol and thereby imparting hydrophilic property to the liquid contact faces of the optical element 2 and the flow passage formation member 70. That is, when using water as the liquid LQ, a thin film with a highly polar molecular structure, such as an OH group, is preferably provided on the liquid contact faces. Alternatively, a hydrophilic material such as $MgF_2$, $Al_2O_3$, and $SiO_2$ may be provided on the liquid contact faces.

The bottom face (the face which faces the substrate P side) 70A of the flow passage formation member 70 is almost flat, and the bottom face (liquid contact face) 2A of the optical element 2 is also flat, the bottom face 70A of the flow passage formation member 70 and the bottom face 2A of the optical element 2 being arranged approximately in a single plane. This enables the immersion region AR2 to be satisfactorily formed over a wide range.

The bottom face 70A of the flow passage formation member 70 and the bottom face 2A of the optical element 2 need not be arranged in a single place, and there may acceptably be a step between the bottom face 70A of the flow passage formation member 70 and the bottom face 2A of the optical element 2. For example, the bottom face 2A of the optical element 2 may deviate from the bottom face 70A of the flow passage formation member 70 toward the +Z direction side.

The top face 51 of the substrate stage PST is a flat face (flat section), and is given water-repellant property by water-repellant treatment. For example, this water-repellant treatment of the top face 51 may be performed by applying a water-repellant material such as a fluororesin material or an acrylic resin material, or by coating a thin-film of the water-repellant material. A material which is insoluble with respect to the liquid LQ is used as the material for obtaining water-repellant. All or part of the substrate stage PST may be formed from a water-repellant material, including among others a fluororesin such as polytetrafluoroethylene (Teflon®). The plate member 50, which includes the top face 51 of the substrate stage PST, may also be formed from a water-repellant material such as polytetrafluoroethylene.

The reference member 300 is arranged on the substrate stage PST at a predetermined position on the outer side of the substrate P. The substrate side reference mark PFM, which the substrate alignment system 350 detects not through liquid, and the reference mark MFM, which the mask alignment system 360 detects through the liquid, are provided on the reference member 300 in a predetermined positional relationship. Atop face 301A of the reference member 300 is almost a flat face (flat section), and is arranged at approximately the same height as (in single plane with) the substrate P surface held on the substrate stage PST and the top face 51 of the substrate stage PST. The top face 301A of the reference member 300 can also function as a reference face of the focus detection system 30. The substrate alignment system 350 detects an alignment mark 1 formed on the substrate P.

Although not shown in the figure, a luminance unevenness sensor such as that disclosed in Japanese Unexamined Patent Publication, First Publication No. S57-117238 is provided as a sensor for measurement on the substrate stage PST at a predetermined position on the outer side of the substrate P. The luminance unevenness sensor includes a top plate having a flat face (flat section) provided at almost the same height as (within a single plane with) the surface of the substrate P held by the substrate stage PST and the top face 51 of the substrate stage PST. A light-receiving element (detector) which forms the luminance unevenness sensor is buried in the substrate stage PST (below the top plate), and receives the exposure light via the liquid on the top plate. Similarly, an aerial image-measuring sensor such as that disclosed in Japanese Unexamined Patent Publication, First Publication No. 2002-14005 is provided as a sensor for measurement on the substrate stage PST at a predetermined position on the outer side of the substrate P. The aerial image-measuring sensor includes a top plate having a flat face (flat section) provided at almost the same height as (within a single plane with) the surface of the substrate P held by the substrate stage PST and the top face 51 of the substrate stage PST. An irradiance level sensor (luminance sensor) such as that disclosed in Japanese Unexamined Patent Publication, First Publication No. H11-16816 is provided on the substrate stage PST, with a top plate of the irradiance level sensor arranged at almost the same height as (in a single plane with) the surface of the substrate P held by the substrate stage PST and the top face 51 of the substrate stage PST. Each of the sensors for measurement described above obtains measurements by receiving light through the liquid above its top plate.

Subsequently, a method of exposing a pattern of a mask M onto the substrate P using the exposure apparatus EX of the above configuration will be explained.

It is assumed here that, before starting exposure of the substrate P, the positional relationship between detection reference positions of the substrate alignment system 350 and projection positions of the pattern image of the mask M has already been measured using the substrate alignment system 350, the mask alignment system 360, the reference member 300, etc.

It is also assumed that the various types of sensors mounted on the substrate stage PST have finished measuring, and that adjustments such as correction have been made based on these measurement results.

Figure 2:
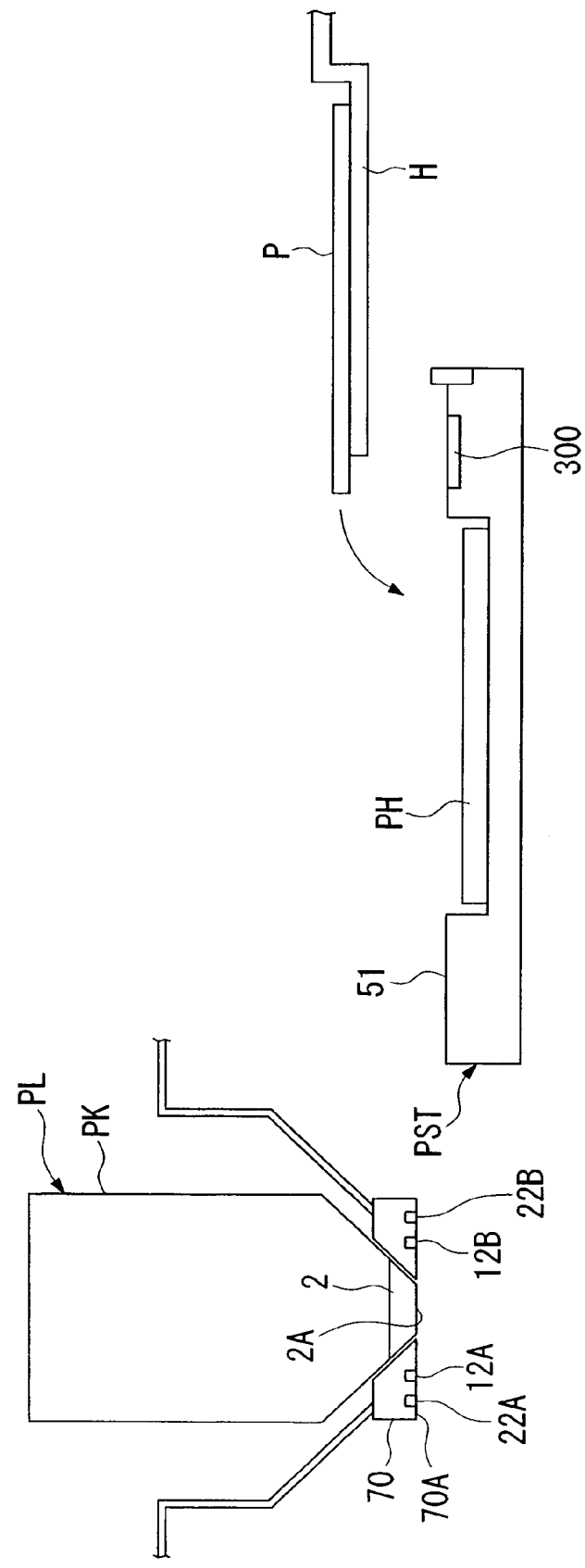
FIG. 2 is a diagram showing a state where liquid supply from a liquid supply mechanism is stopped.

Firstly, as shown in FIG. 2, the substrate P which is the target of exposure processing is loaded onto the substrate stage PST by a loading system (loading device) H. Upon loading the substrate P onto the substrate stage PST, the substrate stage PST is moved to a load position away from the projection optical system PL. At the load position, the substrate P is loaded onto the substrate stage PST by the loading system H.

When the substrate stage PST is at the load position, the control device CONT closes the flow passages of the supply pipes 13 by driving the valves 15, and stops the supply of the liquid from the liquid supply mechanism 10. As described above, the a time during which the supply of the liquid from the liquid supply mechanism is stopped 10 is monitored by the measuring device 60.

In order to perform alignment exposure on the substrate P, the control device CONT uses the substrate alignment system 350 to measure alignment marks 1 which are formed in accompaniment in each of a plurality of shot regions on the substrate P. While the substrate alignment system 350 is measuring the alignment marks 1, the laser interferometer 43 measures the position of the substrate stage PST. The control device CONT measures the alignment marks 1 while the immersion regions for the liquid LQ are not formed on the substrate P (non-immersed state). While measuring the alignment marks 1, the control device CONT closes the flow passages of the supply pipes 13 of the liquid supply mechanism 10 by driving the valves 15, and stops the supply of the liquid from the liquid supply mechanism 10, whereby the measuring device 60 continues to measure the liquid supply stopping time.

Based on the detection result of the alignment marks 1, the control device CONT determines positional information of the shot regions with respect to the detection reference positions of the substrate alignment system 350, and moves the substrate stage PST based on the positional information and a base line amount measured earlier, thereby aligning the projection positions of the pattern image of the mask M with the shot regions.

When exposure of the shot regions of the substrate P starts, the control device CONT opens the flow passages of the supply pipes 13 by driving the valves 15, and allows the liquid supply mechanism 10 to supply liquid. The measuring device 60 detects that the flow passages of the supply pipes 13 have opened, stops measuring the liquid supply stopping time, and resets the measuring time (returns it to zero). In parallel with the supply of the liquid LQ by the liquid supply mechanism 10 onto the substrate P, the control device CONT makes the liquid collection mechanism 20 collect the liquid LQ and moves the substrate stage PST supporting the substrate P in the X-axis direction (scanning direction) while projecting a pattern image of the mask M onto the substrate P via the liquid LQ between the projection optical system PL and the substrate P and via the projection optical system PL.

The liquid LQ which is supplied from the liquid supplier 11 of the liquid supply mechanism 10 in order to form the immersion region AR2 flows along the supply pipes 13A and 13B, and is then supplied via the supply flow passages formed in the flow passage formation member 70 onto the substrate P from the liquid supply openings 12A and 12B. The liquid LQ supplied onto the substrate P from the liquid supply openings 12A and 12B is supplied such that it wets and spreads between the bottom end face of the frontal end (optical element 2) of the projection optical system PL and the substrate P, whereby the immersion region AR2, which is smaller than the substrate P and larger than the projection region AR1, is locally formed a part of the substrate P which includes the projection region AR1. At this time in the liquid supply mechanism 10, the control device CONT simultaneously supplies the liquid LQ from each of the liquid supply openings 12A and 12B, arranged on both sides of the X-axis direction (scanning direction) of the projection region AR1, onto the substrate P from both sides of the projection region AR1 in relation to the scanning direction. This forms the immersion region AR2 evenly and satisfactorily.

The exposure apparatus EX of this embodiment projects the pattern image of the mask M onto the substrate P while moving the mask M and the substrate P in the X-axis direction (scanning direction); during scanning exposure, a pattern image of part of the mask M is projected into the projection region AR1 via the liquid LQ in the immersion region AR2 and the projection optical system PL, and, in synchronism with the motion of the mask M in the –X direction (or the +X direction) at velocity V, the substrate P moves in the +X direction (or the –X direction) with respect to the projection region AR1 at a velocity $\beta \cdot V$ ($\beta$ being the projection magnification). A plurality of shot regions are set on the substrate P, and, after completing exposure to one shot region, a stepping motion of the substrate P moves the next shot region is moved to the scanning start position, and this step-and-scan method is thereafter performed sequentially in each shot region while moving the substrate P.

After immersion exposure of the substrate P ends, the control device CONT closes the flow passages of the supply pipes 13 by driving the valves 15, and stops the supply of the liquid from the liquid supply mechanism 10. The measuring device 60 detects the fact that the flow passages of the supply pipes 13 have been closed by the valves 15, and using that time as a reference, starts measuring the time that the flow passages of the supply pipes 13 are closed, i.e., the a time during which the supply of the liquid from the liquid supply mechanism is stopped 10. The measuring device 60 outputs a measurement result of the stopping time to the control device CONT.

After stopping the supply of the liquid from the liquid supply mechanism 10, the control device CONT continues driving the liquid collection mechanism 20 for a predetermined period of time, and collects the liquid LQ which remains on the exposed substrate P and on the substrate stage PST holding the substrate P. While the liquid collection mechanism 20 is collecting the liquid LQ, the substrate stage PST may move in the XY direction with respect to the liquid collection openings 22. This enables the remaining liquid LQ to be collected over a wide range on the substrate P and the substrate stage PST.

After the liquid supply mechanism 10 stops supplying liquid and the operation of collecting liquid from the substrate P and the substrate stage PST ends, the control device CONT moves the substrate stage PST to an unload position away from the projection optical system PL. At the unload position, the exposed substrate P on the substrate stage PST is unloaded by an unloading system (unloading device).

As described above, during loading and unloading of the substrate P, and during measuring processes and the like performed by the substrate alignment system 350 in the non-immersed state, the measuring device 60 measures (monitors) the liquid supply stopping time of the liquid supply mechanism 10.

As the liquid supply stopping time of the liquid supply mechanism 10 (the time from the start of stopping liquid supply of the liquid supply mechanism 10 until restarting liquid supply) increases, the liquid LQ remaining in the supply pipes 13 becomes stagnant and the cleanliness decreases. When this liquid of reduced cleanliness is supplied onto the substrate P or onto the substrate stage PST (including the reference member 300 and the sensors for measuring) during subsequent exposure and measuring processes of the substrate P, the inside of the supply pipes 13, the substrate P, and members on the substrate stage PST may become contaminated and the exposure precision and the measuring precision may deteriorate.

Accordingly, the control device CONT compares the stopping time measured by the measuring device 60 with a predetermined allowable time, and, when the liquid supply stopping time exceeds the predetermined allowable time, the control device CONT restarts the supply of the liquid from the liquid supply mechanism 10. For example, if a problem occurs when unloading the substrate P, and the substrate P whose exposure is complete continues to be held on the substrate stage PST, there is a possibility that the liquid supply stopping time will exceed the predetermined allowable time. When the liquid supply stopping time exceeds the predetermined allowable time in this way, the control device CONT restarts the supply of the liquid from the liquid supply mechanism 10. Consequently, the liquid LQ remaining in the supply pipes 13 can be flushed out and prevented from remaining in them. This prevents the problems caused by reduced cleanliness of the liquid LQ in the supply pipes 13.

The allowable time (i.e., the allowable time from starting stopping of the supply of the liquid from the liquid supply mechanism 10 until restarting the liquid supply) can be set based on a time at which the cleanliness of liquid LQ remaining in the supply pipes 13 does not decrease below a permissible level. Information relating to this allowable time is determined beforehand by tests, simulations, and so on, and is stored in the storage device MRY.

For example, if the liquid LQ is left to accumulate in the supply pipes 13 for a long period of time as described above, fungi such as bacteria proliferate in the supply pipes 13 and near the liquid supply openings 12, reducing the cleanliness of the liquid LQ. Preferably therefore, the allowable time is determined taking into a consideration the proliferation time of bacteria in the flow passages of the supply pipes 13. In the case, a allowable time $T_B$ can be determined beforehand by tests and simulations, and stored in the storage device MRY. When the a time during which the supply of the liquid from the liquid supply mechanism is stopped 10 exceeds the allowable time $T_B$, which is determined taking into a consideration the proliferation time of bacteria, supply of liquid from the liquid supply mechanism 10 restarts, making it possible to prevent generation (proliferation) of bacteria in the supply pipes 13 and near the liquid supply openings 12.

During immersion exposure of the substrate P, the exposure light EL is irradiated onto the substrate P with the bottom face 2A of the projection optical system PL contacting the liquid LQ (immersed state); when this immersion exposure of the substrate P ends, after reverting to the non-immersed state by performing a collection operation of the liquid LQ, if the liquid LQ is allowed to stick to (remain on) the bottom face 2A of the projection optical system PL for a long period of time, the liquid LQ may dry and form marks of remaining liquid (hereinafter 'watermarks') on the bottom face 2A of the projection optical system PL, leading to problems such as those caused by foreign particles sticking to the watermarks. Watermarks are thought to be caused when the liquid LQ stuck to the bottom face 2A dries after surrounding impurities merge into it. On the other hand, it is thought that watermarks can be suppressed and removed by moistening the bottom face 2A with the liquid LQ. Therefore, the allowable time may be determined taking into a consideration the drying time of the liquid LQ stuck to the bottom face 2A of the projection optical system PL. Alternatively, it may be determined such that impurities do not stick to the bottom face 2A due to drying of the liquid LQ sticking to the bottom face 2A of the projection optical system PL. A allowable time $T_{WM}$ relating to watermark formation can be determined beforehand by tests and simulations, and stored in the storage device MRY. The control device CONT uses the measuring device 60 to measure the time elapsing from the immersed state of the bottom face 2A of the projection optical system PL until its non-immersed state, and, when this elapsed time (i.e., the a time during which the supply of the liquid from the liquid supply mechanism is stopped 10) exceeds the allowable time $T_{WM}$, restarts the supply of the liquid from the liquid supply mechanism 10 such that the bottom face 2A of the projection optical system PL contacts the liquid LQ (such as to be moistened by the liquid LQ), thereby preventing the generation of watermarks.

Figure 3:
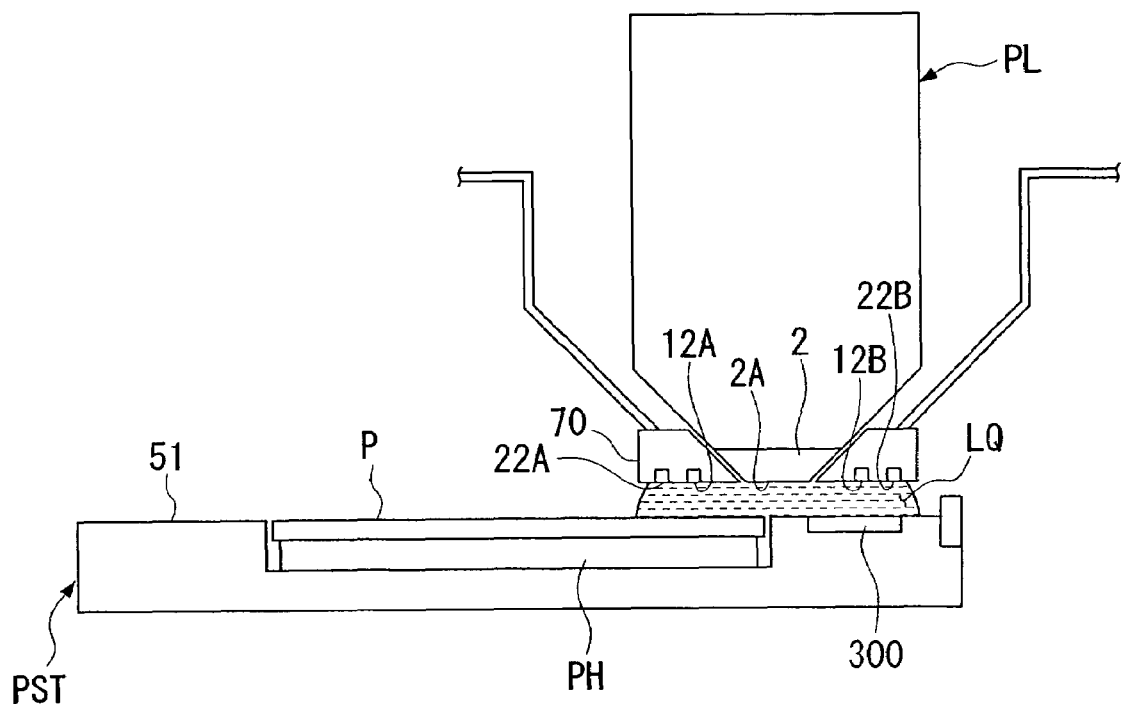
FIG. 3 is a diagram showing a state where liquid supply from a liquid supply mechanism is restarted.

When the time elapsed from shifting from the immersed state to the non-immersed state exceeds the allowable time $T_{WM}$, and the supply of the liquid from the liquid supply mechanism 10 restarts, the projection optical system PL and the flat face on the substrate stage PST are aligned facing each other, as shown in FIG. 3, before restarting the supply of the liquid from the liquid supply mechanism 10. That is, when the a time during which the supply of the liquid from the liquid supply mechanism is stopped 10 exceeds the predetermined allowable time, the control device CONT determines, based on the measurement result of the laser interferometer 43, whether the projection optical system PL and the flat face on the substrate stage PST are facing each other, and, when it determines that the projection optical system PL and the flat face on the substrate stage PST are facing each other, restarts the supply of the liquid from the liquid supply mechanism 10. This enables the bottom face 2A of the projection optical system PL to be moistened by the liquid LQ. The flat face on the projection optical system in this case includes the top face 51 of the substrate stage PST, the substrate P surface held by the substrate stage PST, the reference member 300, and the top plates of the sensors for measuring (the luminance unevenness sensor, the aerial image-measuring sensor, etc.). When the control device CONT determines that the projection optical system PL and the flat face on the substrate stage PST are not facing each other, it moves the substrate stage PST based on the measurement result of the laser interferometer 43 such that the projection optical system PL and the flat face of the substrate stage PST are facing each other, and then starts the supply of the liquid from the liquid supply mechanism 10. The substrate P is preferably held on the substrate stage PST when starting the supply of the liquid from the liquid supply mechanism 10.

As described above, after measuring in the immersed state, where the liquid LQ is arranged on the reference member 300 and on the top plates of the sensors for measuring, and then shifting to the non-immersed state, there is a possibility that watermarks will form on the reference member 300 and on the top plates of the sensors for measuring, or the top face 51 of the substrate stage PST, and the like. Accordingly, when moistening the bottom face 2A of the projection optical system PL, the liquid LQ is supplied from the liquid supply mechanism 10 with the projection optical system PL facing the reference member 300 (or the top plates of the sensors for measuring), thereby preventing watermarks from forming on the bottom face 2A of the projection optical system PL and preventing the problem of watermarks forming on the reference member 300 and the like.

When $T_B$ is the allowable time determined taking into a consideration the proliferation time of bacteria, $T_{WM}$ is the allowable time which is determined taking into a consideration the watermark formation time, and T is the a time during which the supply of the liquid from the liquid supply mechanism is stopped 10 (the time lapse between the immersed state and the non-immersed state), liquid supply may be restarted when $T=\min(T_B, T_{WM})$.

The allowable time is not limited only to $T_B$ and $T_{WM}$ mentioned above, and may be determined beforehand also with regard to the reference member 300, the top plates, the top face 51, and so on, the reference member 300 and so on being moistened with the liquid LQ when the time lapse from their immersed state to their non-immersed state exceeds the allowable time. By preventing formation of watermarks on the reference member 300, the top plates, and so on in this manner, it is possible to prevent deterioration in the measuring precision of the sensors which use the reference member 300 and the top plates.

In one conceivable configuration of the focus detection system 30, predetermined optical members among the plurality of optical members which form the optical system of the focus detection system 30 may be made to contact the immersion region AR2. Therefore, the allowable time may be determined in order to prevent formation of watermarks on these optical members, the supply of the liquid from the liquid supply mechanism 10 being restarted when the allowable time is exceeded. This can maintain the detection precision of the focus detection system 30.

After loading the substrate P onto the substrate stage PST, during the series of processes of immersion-exposing the substrate P and unloading it from the substrate stage PST, the supply of the liquid from the liquid supply mechanism 10 may be restarted when the liquid supply stopping time exceeds the allowable time. For example, if the allowable time $T_B$ (or $T_{WM}$) is exceeded during measuring of the substrate side reference marks PFM on the reference member 300 or the alignment marks 1 on the substrate P while the liquid supply is stopped and the substrate alignment system 350 is in the non-immersed state, the measuring operation of the substrate alignment system 350 is temporarily halted, a flat face on a different substrate stage PST from that of the reference member 300 is aligned facing the bottom face 2A of the projection optical system PL, and liquid supply restarts. After moistening the bottom face 2A of the projection optical system PL, the liquid collection mechanism 20 collects the liquid LQ and the measuring operation of the substrate alignment system 350 may be restarted.

While the embodiment describes an example of a series of processes performed after loading the substrate P onto the substrate stage PST, whereby the substrate P is immersion-exposed and unloaded from the substrate stage PST, the liquid supply can of course be restarted during maintenance of the exposure apparatus EX or during manual assistance. That is, a situation where the supply of the liquid from the liquid supply mechanism 10 must be stopped can arise not only during replacement of the substrate P, but also during maintenance and the like of the exposure apparatus EX such as when replacing components. In such cases, the a time during which the supply of the liquid from the liquid supply mechanism is stopped 10 is measured by the measuring device 60, and an appropriate procedure can be performed based on the measurement result. For example, when the substrate P is exceeded while the supply of the liquid from the liquid supply mechanism 10 is stopped during maintenance of the exposure apparatus EX, the substrate stage PST may be moved such that it faces the bottom face 2A of the projection optical system PL, and the supply of liquid is then restarted. As another example, when the substrate P which is the target of exposure processing is not being held on the substrate stage PST (the substrate holder PH) due to maintenance, a loading error, or the like, it is acceptable to place a dummy substrate on the substrate stage PST, move the substrate stage PST below the projection optical system PL, and then restart the liquid supply. By restarting the liquid supply while the substrate holder PH is holding the substrate P or a dummy substrate in this manner, it is possible to prevent problems of leaking current and rust caused by the liquid LQ wetting and spreading into the concave 55 of the substrate stage PST and the like.

As described above, the a time during which the supply of the liquid from the liquid supply mechanism is stopped 10 is measured using the measuring device 60, and, based on the measurement result, an appropriate procedure, such as a flushing operation of restarting the supply of the liquid LQ before it stagnates and cleanliness decreases, can be performed, thereby preventing the problem of supplying liquid LQ of reduced cleanliness onto the substrate P, the reference member 300 which functions as a measuring member, and the top plates of the sensors for measuring. Based on the measurement result of the measuring device 60, it is also possible to perform an appropriate procedure, such as moistening the bottom face 2A of the projection optical system PL and the top of the reference member 300 with the liquid LQ, before watermarks are formed. Therefore, the problem of watermarks forming on the bottom face 2A of the projection optical system PL and the like can be prevented. Thus, even if there is a possibility of problems arising due to stopping of the supply of the liquid from the liquid supply mechanism 10, an appropriate procedure can be performed based on the measurement result of the measuring device 60, whereby generation of problems can be prevented.

While one conceivable method of preventing generation of bacteria and the like is to add an additive such as an anticorrosive to the liquid LQ, when using pure water as the liquid LQ as in this embodiment, it is preferable not to add an additive since it will change the material characteristics of the liquid LQ. Therefore, by flushing (cleaning) the supply pipes 13 by restarting the supply of liquid as in the invention, generation of bacteria can be prevented without altering the material characteristics of the liquid LQ to deal with bacteria.

The liquid LQ, which is supplied from the liquid supply mechanism 10 in order to clean the supply pipes 13 and as a countermeasure against watermarks on the bottom face 2A, may be collected by another collection mechanism instead of the liquid collection mechanism 20. On the other hand, since there is a possibility that bacteria will be generated in the liquid collection openings 22 and the collection pipes 23 of the liquid collection mechanism 20, they can be cleaned by liquid collection using the liquid collection mechanism 20.

As described above, when starting the liquid supply, the substrate stage PST is moved such that it faces the bottom face 2A of the projection optical system PL; here, the fact that the substrate stage PST has moved and the fact that the liquid supply has restarted may be reported using a predetermined warning device. This enables an operator, who is performing an operation in the exposure apparatus EX during maintenance or the like, to be informed that the substrate stage PST has moved and that the liquid supply has restarted. Means such as a warning sound, a warning light, or a display, can be used as the warning device.

If the time measured by the measuring device 60 exceeds the predetermined allowable time, the predetermined warning device need only notify the operator of this fact. This enables the operator to execute control to restart the supply of the liquid from the liquid supply mechanism 10.

When restarting the liquid supply, instead of a configuration where the bottom face 2A of the projection optical system PL is facing the substrate stage PST, a member (device) other than the substrate stage PST including a flat face may be arranged facing the bottom face 2A of the projection optical system PL.

For example, when a stage for measurement is provided separate from the substrate stage PST as disclosed in Japanese Unexamined Patent Publication, First Publication No. H11-135400, the supply of the liquid from the liquid supply mechanism 10 may be started with the sensor for measurement facing the projection optical system PL.

Preferably in such cases, the control device CONT starts the supply of the liquid from the liquid supply mechanism 10 after determining whether the other member such as the stage for measurement is facing the projection optical system PL.

When performing the plurality of processes described above (loading, measuring, and exposing) sequentially, a sequence for performing them may be set such that the allowable time is not exceeded. For example, although the possibility that the liquid supply stopping time will exceed the allowable time increases if the substrate alignment system 350 measures the substrate side reference marks PFM and then continues by measuring the alignment marks 1 on the substrate P in the non-immersed state, this possibility can be reduced by, for example, alternating the processes performed in the non-immersed state with those performed in the immersed state, such as measuring of mask side reference mark MFM by the mask alignment system 360 and measuring using the luminance unevenness sensor. When sequentially performing a plurality of processes in the non-immersed state and the immersed state based on the allowable time in this way, the sequence of the plurality of processes may be set based on the allowable time.

While in the embodiment described above, the measuring device 60 detects whether the valves 15 have closed the flow passages of the supply pipes 13, it is acceptable if the measuring device 60 is incorporated in the control device CONT and starts measuring time when the control device CONT controls the valves 15 such as to close the flow passages of the supply pipes 13.

While in the embodiment described above, the stop of the supply of the liquid from the liquid supply mechanism 10 is determined from the operation of the valves 15, it can also be determined based on the measurement results of the flow meters 16 as mentioned above. Therefore, when the supply of the liquid from the liquid supply mechanism 10 stops, the control device CONT may start measuring time using the measuring device 60, based on the measurement results of the flow meters 16.

It is also acceptable for the measuring device 60 to start measuring time using as a reference the point where the amount of flow measured by the flow meters 16 provided in the supply pipes 13 drops below a predetermined amount.

Since flow meters can also be provided in the collection pipes 23 to monitor the amount of flow in them, making it possible to detect that the supply of the liquid from the liquid supply mechanism 10 has stopped and that the bottom face 2A of the projection optical system PL has reached the non-immersed state, the measuring device 60 may start measuring time using as a reference the point where the amount of flow measured by the flow meters provided in the collection pipes 23 drops below a predetermined amount.

It is also acceptable to mount a sensor which detects the existence/nonexistence of liquid on the image surface side of the optical element 2 of the projection optical system PL, and make the measuring device 60 start measuring time using the fact that the sensor detects no water as a reference. For example, the focus detection system 30 may be used as this sensor. The detection light (reflected light) of the focus detection system 30 passes the image surface side of the projection optical system PL, and, since a detection error is generated in the focus detection system 30 when there is no more liquid LQ on the image surface side of the projection optical system PL, i.e., on the optical path of the detection light (reflected light), the existence/nonexistence of liquid on the image surface side of the optical element 2 of the projection optical system PL can be confirmed by monitoring this detection error.

As described above, a plurality of mechanisms may be provided in order to detect the stop of the supply of the liquid from the liquid supply mechanism 10, and the non-immersed state of the bottom face 2A of the optical element 2 of the projection optical system PL, and these mechanisms may be combined as appropriate before the measuring device 60 starts measuring time.

When there is a possibility that the stopping time of liquid supply from the liquid supply mechanism 10 during maintenance or the like of the exposure apparatus EX may exceed the allowable time, it is acceptable if the supply of the liquid from the liquid supply mechanism 10 and the liquid collection performed by the liquid collection mechanism 20 are continued for a predetermined time, and clean liquid LQ is used to clean the liquid contact faces such as bottom face 2A of the optical element 2 of the projection optical system PL, the bottom face 70A of the flowpath formation member 70, and the top face 51 of the substrate stage PST, before stopping the supply of the liquid from the liquid supply mechanism 10. Consequently, even if the liquid LQ remains on the bottom face 2A of the projection optical system PL and the like, since impurities and pollutant contained in the liquid LQ can be reduced, the formation of marks such as watermarks can be suppressed.

Furthermore in the embodiment described above, problems caused by a long a time during which the supply of the liquid from the liquid supply mechanism is stopped 10 are prevented by restarting the supply of the liquid from the liquid supply mechanism 10 when the stopping time exceeds a predetermined allowable time. However, there are cases where, even though the predetermined substrate P elapses, the liquid supply cannot start due to repair of various errors and maintenance. In such cases, it is acceptable to continue measuring the stopping time of the liquid supply and, based on the result, replace the supply pipes 13, the optical element 2, and the like.

While the embodiment described above measures the stopping time of the liquid supply to the emission side (image surface side) of the optical element 2 of the projection optical system PL, when the optical path space on the incident side of the immersion region AR2 of the projection optical system PL is filled with liquid (pure water), as disclosed in International Publication No. 2004/019128, it is acceptable to measure the stopping time of the liquid supply to the incident side of the optical element 2, or the time from the moment when the incident side of the optical element 2 switches from an immersed state to a non-immersed state While in the embodiment described above, the time of the non-immersed state of the bottom face 2A of the optical element 2 of the projection optical system PL mounted on the exposure apparatus EX can be measured by measuring the a time during which the supply of the liquid from the liquid supply mechanism is stopped 10, as for example disclosed in International Publication No. 2004/05729, various measurements can also be made by during adjustment steps and the like prior to mounting the projection optical system PL in the exposure apparatus EX, by immersing the bottom face 2A of the projection optical system PL in liquid. Preferably in such cases, the time from the immersed state of the bottom face 2A of the projection optical system PL to its non-immersed state is measured, and the bottom face 2A is immersed in the liquid if, for example, this time exceeds a predetermined allowable time.

As described above, the liquid LQ in this embodiment is pure water. Pure water has advantages of being easy to obtain in large quantities at semiconductor manufacturing factories and the like, and of not affecting the photoresist on the substrate P, optical elements (lenses) and the like. Since pure water does not affect the environment and contains remarkably few impurities, it may also be expected to clean the surface of the substrate P and the surfaces of optical elements provided on the front end face of the projection optical system PL. When pure water supplied from a factory or the like has a low level of purity, the exposure apparatus EX may be provided with an ultra-pure water manufacturing apparatus.

The refractive index n of pure water (water) with respect to the exposure light EL with a wavelength of approximately 193 nm is said to be about 1.44, and, when using an ArF excimer laser (wavelength 193 nm) as the source for the exposure light EL, the wavelength is shortened to 1/n (i.e., approximately 134 nm), obtaining a high-resolution image on the substrate P. Since the depth of field is enlarged approximately n times (i.e., approximately 1.44 times) in comparison with transmission through air, when the depth of field need only be approximately the same as that in air, the numerical aperture of the projection optical system PL can be increased, further enhancing the resolution.

When using the immersion method described above, the numerical aperture NA of the projection optical system may rise to between 0.9 and 1.3. When the numerical aperture of the projection optical system increases in this way, the polarization effect of randomly polarized light which is conventionally used as exposure light may reduce the image-forming performance, and for this reason it is preferable to use polarized irradiation. Linearly polarized light is irradiated in alignment with the longitudinal direction of the line pattern of a mask (reticule), and diffracted light of an S-polarized light component (TE-polarized light component), i.e., a polarization direction component along the longitudinal direction of the line pattern, is copiously emitted from the pattern of the mask (reticule). When the space between the projection optical system PL and the photoresist applied to the substrate P is filled with liquid, the diffracted light of the contrast-enhancing S-polarized light component (TE-polarized light component) has higher transmittivity against the resist surface than when this space is filled with air (gaseous body), making it possible to achieve high resolution performance even when the numerical aperture NA of the projection optical system exceeds 1.0. It is even more effective to combine a phase-shift mask with a oblique-incidence illumination method (particularly a dipole illumination method) which matches the longitudinal direction of the line pattern such as that disclosed in Japanese Unexamined Patent Application, First Publication No. H6-188169.

When, for example, exposure light EL from an ArF excimer laser is used by a projection optical system PL with a reduced magnification of approximately one-quarter in projecting a minute line-and-space pattern (e.g. line-and-space of approximately 25 to 50 nm) onto the substrate P, a waveguide effect allows the mask M to function as a polarization plate, whereby more of the S-polarized component (TE-polarized component) is emitted from the mask M than diffracted light of a contrast-reducing P-polarized component (TM-polarized component); while it is therefore preferable to use linearly polarized irradiation, high resolution performance can also be obtained by irradiating the mask M with randomly polarized light even if the numerical aperture NA of the projection optical system PL is as large as between 0.9 and 1.3. When exposing an extremely minute line-and-space pattern of the mask M onto the substrate P, although a wire grid effect may make the P-polarized component (TM-polarized component) larger than the S-polarized component (TE-polarized component), if, for example, exposure light EL from an ArF excimer laser is used by a projection optical system PL with a reduced magnification of approximately one-quarter in projecting a line-and-space of larger than 25 nm onto the substrate P, a waveguide effect allows the mask M to function as a polarization plate, more diffracted light of the S-polarized component (TE-polarized component) is emitted from the mask M than diffracted light of the P-polarized component (TM-polarized component), and consequently, high resolution performance can be obtained even if the numerical aperture NA of the projection optical system PL is as large as between 0.9 and 1.3.

Furthermore, in addition to illumination using linearly polarized light (S-polarized illumination) along the longitudinal direction of the line pattern of a mask (reticule), it is also effective to combine a oblique-incidence illumination method with a polarized light illumination method which irradiating linearly polarized light in a circular tangential (circumferential) direction centered around an optical axis, as disclosed in Japanese Unexamined Patent Publication, First Publication No. H6-53120. In particular, when the pattern of the mask (reticule) include not only a line pattern extending in one predetermined direction but also a line pattern extending in a plurality of different directions, by combining an orbicular zone illumination method with the polarized light irradiation method of irradiating linearly polarized light in the circular tangential direction around an optical axis as disclosed in Japanese Unexamined Patent Publication, First Publication No. H6-53120 mentioned above, high resolution performance can be obtained even if the numerical aperture NA of the projection optical system PL is large.

In this embodiment, the optical element 2 is attached to the frontal end of the projection optical system PL, enabling the optical characteristics of the projection optical system PL such as aberration (spherical aberration, coma aberration, etc.) to be adjusted using this lens. The optical element attached at the frontal end of the projection optical system PL may be an optical plate using in adjusting the optical characteristics of the projection optical system PL. Alternatively, a parallel plane plate capable of transmitting the exposure light EL may be used.

When the flow of the liquid LQ generates considerable pressure between the substrate P and the optical element at the front end of the projection optical system PL, instead of enabling the optical element to be replaced, it may be firmly securely such that its does not move due to this pressure.

While in this embodiment, the space between the projection optical system PL and the substrate P surface is filled with the liquid LQ, another example is to attach a cover glass including the parallel plane plate to the surface of the substrate P and fill the space with the liquid LQ in this state.

While in this embodiment, the liquid LQ is water, other liquids may be used. For example, when the light source for the exposure light EL is an $F_2$ laser, since this $F_2$ laser light does not transmit through water, a liquid which $F_2$ laser light can be transmitted through may be used instead, e.g. perfluorinated polyether (PFPE) or a fluorinated fluid such as fluorinated oil. In this case, liquid affinity treatment may be performed by forming a thin film of, for example, a substance having low-polarity molecular structure including fluorine in the portion which contacts the liquid LQ. In addition, a fluid which can transmit the exposure light EL, has a refractive index as high as is possible, and is stable with respect to the photoresist applied to the projection optical system PL and the substrate P surface (e.g. cedarwood oil) can be used as the liquid LQ. Surface-treatment in this case is similarly performed in accordance with the polarity of the liquid being used.

Note that as the substrate P of each of the above embodiments it is possible to use not only a semiconductor wafer for manufacturing a semiconductor device, but also a glass substrate for display device, a ceramic wafer for thin-film magnetic head, or an original plate (synthetic quartz, silicon wafer) for a mask and a reticule used in an exposure apparatus, etc.

As the exposure apparatus EX, in addition to a scanning-type exposure apparatus (scanning stepper) using a step-and-scan method of scanning/exposing a pattern of the mask M while moving the mask M in synchronism with the substrate P, it is possible to utilize a projection exposure apparatus (stepper) using a step-and-repeat method of exposing the pattern of the mask M while the mask M and the substrate P are kept stationary, and then moving the substrate P in sequential steps. The invention can also be applied in an exposure apparatus which uses a step-and-switch method of transferring at least two partially overlapping patterns on the substrate P.

The invention can also be applied in a multi-stage exposure apparatus which includes a plurality of substrate stages capable of holding substrates for processing, such as wafers. For example, structures and exposure operations of a twin stage exposure apparatus including two substrate stages are disclosed in, for example, Japanese Unexamined Patent Publications, First Publication Nos. H10-163099 and H10-214783 (corresponding U.S. Pat. Nos. 6,341,007, 6,400,441, 6,549,269, and 6,590,634), Published Japanese Translation No. 2000-505958 of the PCT International Publication (corresponding U.S. Pat. No. 5,969,441) or U.S. Pat. No. 6,208,407, the contents of which are incorporated herein within the limits permitted by national regulations of countries designated or elected in this international application.

While the above embodiment uses an exposure apparatus where a space between the projection optical system PL and the substrate P is filled with a liquid, the invention can also be applied in an immersion exposure apparatus which performs exposure while the entire surface of the substrate, which is the target of exposure, is covered with the liquid. Structures and exposure operations of an immersion exposure apparatus wherein the entire surface of the substrate, which is the target of exposure, is covered with liquid are disclosed in detail in, for example, Japanese Unexamined Patent Publications No. H6-124873 and H10-303114, U.S. Pat. No. 5,825,043, etc., the contents of which are incorporated herein within the limits permitted by national regulations of countries designated or elected in this international application.

The type of the exposure apparatus EX is not limited to an exposure apparatus for manufacturing semiconductor element which exposes a semiconductor element pattern on the substrate P, and can be widely applied in exposure apparatuses for manufacturing liquid crystal display elements and displays, exposure apparatuses for manufacturing thin-film magnetic heads, charge-coupled devices (CCD), or exposure apparatuses for manufacturing masks and reticules, etc.

When using a linear motor in the substrate stage PST and the mask stage MST (see U.S. Pat. No. 5,623,853 and U.S. Pat. No. 5,528,118), it is possible to use an air suspension type using an air bearing and a magnetic suspension type using Lorentz force or reactance force. The stages PST and MST may be types which move along guides or guideless types which do not include guides.

As the drive mechanisms of the stages PST and MST, it is possible to use plane motors which drive the stages PST and MST by means of electromagnetic force generated by a magnet unit including magnets arranged in two dimensions and an electromechanical unit including a coil arranged in two dimensions, these units being arranged opposite each other. In this case, either one of the magnet unit and the electromechanical unit is connected to the stages PST and MST, and the other one is provided on the moving face side of the stages PST and MST.

Reactive force generated by the motion of the substrate stage PST may be mechanically allowed to escape to the floor (ground) using a frame member such that it is not transmitted to the projection optical system PL, as described in Japanese Unexamined Patent Publication, First Publication No. H8-166475 (U.S. Pat. No. 5,528,118).

Reactive force generated by the motion of the mask stage MST may be mechanically allowed to escape to the floor (ground) using a frame member such that it is not transmitted to the projection optical system PL, as described in Japanese Unexamined Patent Publication, First Publication No. H8-330224 (U.S. Pat. No. 5,874,820).

As described above, the exposure apparatus EX of this embodiment is manufactured by assembling various types of subsystems which contain the constituent elements described in the patent claims in such a manner as to maintain predetermined mechanical, electrical, and optical precision. To maintain these types of precision, adjustments to achieve optical precision of the various optical systems, adjustments to achieve electrical precision of the various electrical systems, and adjustments to achieve mechanical precision of the various mechanical systems are made before and after assembly. The assembly step from the various types of subsystems to the exposure apparatus include mechanical connection, wiring of electrical circuits, piping of atmospheric pneumatic circuits, and so on, between the various subsystems. Of course, individual assembly steps of each of the subsystems are performed prior to this assembly step from the various subsystems to the exposure apparatus. When the assembly step from the various subsystems to the exposure apparatus is completed, overall adjustments are made to ensure the various types of precision of the entire exposure apparatus. Preferably, the exposure apparatus is manufactured in a clean room whose temperature, cleanliness, and the like are managed.

Figure 4:
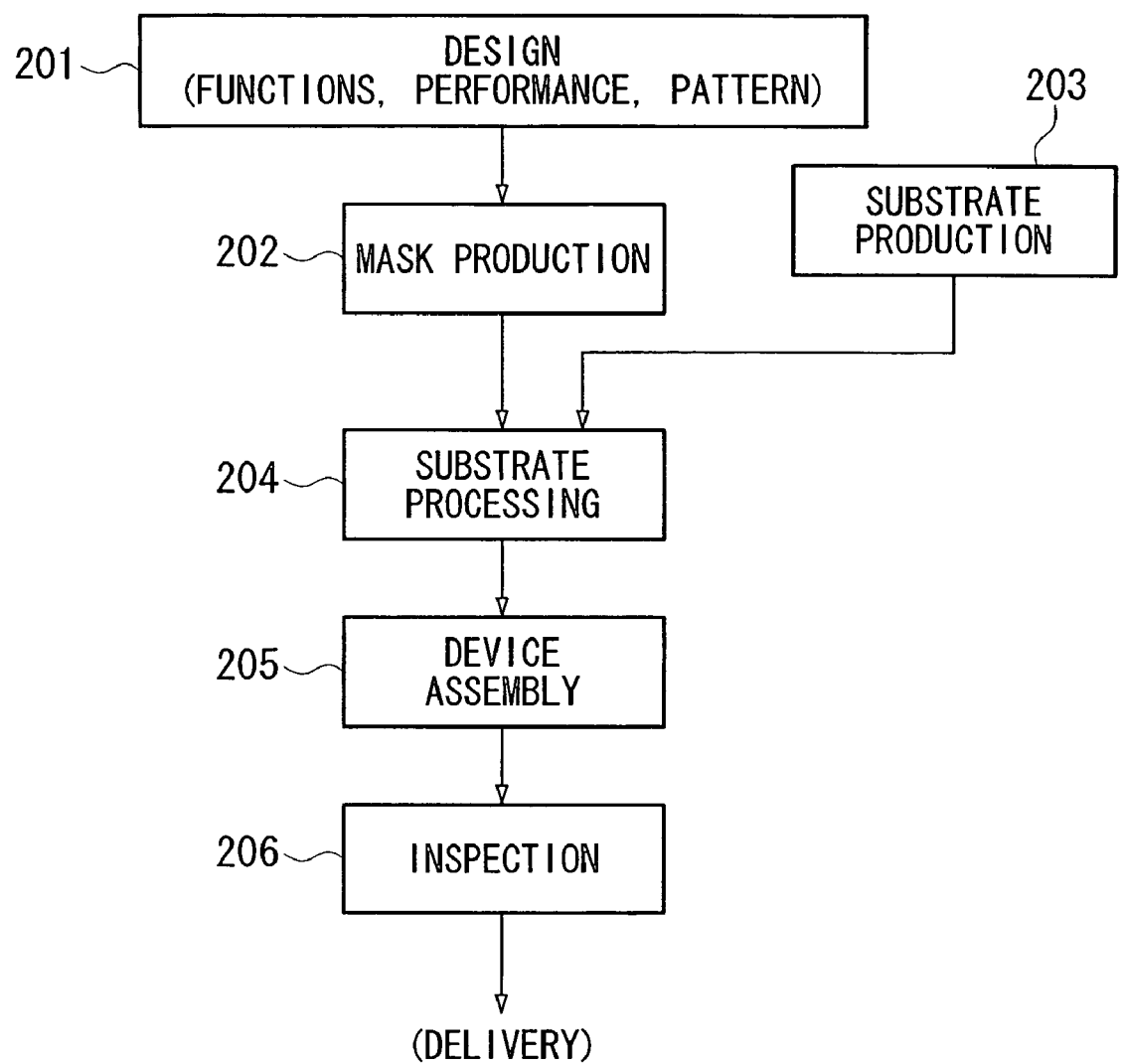
FIG. 4 is a flowchart of an example of manufacturing steps of a semiconductor device.

As shown in FIG. 4, a micro device such as a semiconductor device is manufactured by a step 201 of designing functions/performance of the micro device, a step 202 of producing a mask (reticle) based on the design step, a step 203 of producing a substrate which forms the base material of the device, an exposure processing step 204 of transferring the pattern of the mask onto the substrate by exposure using the exposure apparatus EX of the embodiment described above, a device assembly step (including dicing, bonding, and packaging steps) 205, an inspection step 206, and so on.

The invention claimed is:

1. An exposure apparatus which exposes a substrate by irradiating exposure light onto the substrate via a projection optical system and a liquid, comprising:
   a liquid supply system that supplies the liquid; and
   a measuring device which measures a time during which the supply of the liquid from the liquid supply system is stopped.

2. The exposure apparatus according to claim 1, wherein the supply of the liquid from the liquid supply system is restarted when the stopping time exceeds a predetermined allowable time.

3. The exposure apparatus according to claim 2, wherein the liquid supply system comprises a flowpath that supplies the liquid, and
   the predetermined allowable time is determined taking a proliferation time of bacteria in the flowpath into a consideration.

4. The exposure apparatus according to claim 2, wherein the exposure light is irradiated onto the substrate with an end face of the projection optical system contacting the liquid; and
   the predetermined allowable time is determined taking a drying time of liquid adhered to the end face of the projection optical system into consideration.

5. The exposure apparatus according to claim 4, wherein the predetermined allowable time is determined such that impurities do not adhere to the end face of the projection optical system due to drying of the liquid on the end face.

6. The exposure apparatus according to claim 4, wherein the supply of the liquid from the liquid supply system is restarted such that the end face of the projection optical system contacts the liquid.

7. The exposure apparatus according to claim 2, further comprising a substrate stage which holds the substrate; and wherein,
   when the predetermined allowable time is exceeded, the supply of the liquid from the liquid supply system is restarted with the projection optical system being arranged facing a flat section of the substrate stage.

8. The exposure apparatus according to claim 7, wherein the supply of the liquid from the liquid supply system is restarted with the substrate or a dummy substrate held on the substrate stage.

9. The exposure apparatus according to claim 1, wherein the liquid is pure water.

10. The exposure apparatus according to claim 1, wherein the liquid supply system comprises a flowpath that supplies the liquid and a valve for opening and closing the flowpath; and the stop of the supply of the liquid from the liquid supply system is determined from an operation of the valve.

11. The exposure apparatus according to claim 1, wherein the liquid supply system comprises a flowpath that supplies the liquid and a flow meter that measures an amount of flow of the liquid along the flowpath; and the stop of the supply of the liquid from the liquid supply system is determined based on a measurement result of the flow meter.

12. The exposure apparatus according to claim 2, wherein the supply of the liquid from the liquid supply system is restarted with the projection optical system facing a predetermined object.

13. The exposure apparatus according to claim 12, wherein the object comprises a stage which can move along the end face of the projection optical system.

14. A method for producing a device the method comprising:

transferring a pattern onto a substrate with the exposure apparatus according to claim 1; and processing the substrate to form the device.

15. The exposure apparatus according to claim 1, wherein a controller of the exposure apparatus takes a corrective action when the measured stopping time exceeds a predetermined stopping time.

16. A maintenance method of a projection optical system which projects an image of a pattern via a liquid, comprising:

measuring an elapsed time from when an end face on an image surface side of the projection optical system becomes in an immersed state to when the end face becomes a non-immersed state.

17. The maintenance method according to claim 16, further comprising wetting the end face on the image surface side of the projection optical system with the liquid when the elapsed time exceeds a predetermined allowable time.

18. An exposure method comprising:

exposing, by using a projection optical system maintained using the method according to claim 16, a substrate to light by projecting an image of a device pattern via liquid onto the substrate.

* * * * *